(12) United States Patent
Ohira

(10) Patent No.: US 6,252,468 B1
(45) Date of Patent: Jun. 26, 2001

(54) SIGNAL GENERATOR WITH IMPROVED IMPEDANCE MATCHING CHARACTERISTICS

(75) Inventor: Kazuhide Ohira, Kanagawa (JP)

(73) Assignee: Mitsumi Electric, Co., Ltd., Tokyo (JP)

( * ) Notice: Subject to any disclaimer, the term of this patent is extended or adjusted under 35 U.S.C. 154(b) by 0 days.

(21) Appl. No.: 09/237,887

(22) Filed: Jan. 27, 1999

(30) Foreign Application Priority Data

Feb. 4, 1998 (JP) .................................................. 10-038076

(51) Int. Cl.$^7$ ...................................................... H04B 1/40
(52) U.S. Cl. .................. 331/74; 331/25; 331/96; 455/73; 455/76; 455/264; 455/315
(58) Field of Search ................................ 455/264, 75, 76, 455/112, 315, 73, 84, 260, 278.1; 331/74, 77, 25, 108 C; 375/272

(56) References Cited

U.S. PATENT DOCUMENTS

| | | | |
|---|---|---|---|
| 3,310,746 | * | 3/1967 | Ward ........................................ 331/74 |
| 5,598,405 | * | 1/1997 | Hirose .............................. 327/156 X |
| 5,794,131 | * | 8/1998 | Cairns ..................................... 455/76 |
| 5,878,332 | * | 3/1999 | Wang et al. ............................ 455/84 |

OTHER PUBLICATIONS

RF Design Guide: Systems, Circuits, and Equations pp. 64, 164 & 165 by Peter Vizmuller, 1995.*

* cited by examiner

Primary Examiner—Arnold Kinkead
(74) Attorney, Agent, or Firm—McGuireWoods, LLP

(57) ABSTRACT

A signal generator 5 which generates one of two input signals to a frequency mixing circuit 1 for outputting a signal having a frequency which is a difference between frequencies of the two signals or a sum thereof. In the present invention, an attenuating circuit 6 for attenuating an output signal from a voltage-controlled oscillator 2 for generating one of the input signals as well as a filter circuit 7 for limiting a frequency band of an output signal from the attenuating circuit are interposed between the frequency mixing circuit and a voltage-controlled oscillator 2.

9 Claims, 2 Drawing Sheets

SIGNAL GENERATOR WITH IMPROVED IMPEDANCE MATCHING CHARACTERISTICS

BACKGROUND OF THE INVENTION

1. Field of the invention

The present invention relates to a signal generator using a voltage-controlled oscillator (VCO), and more particularly to a signal generator for generating one input signal of a frequency mixing circuit (MIX).

2. Related art

A VCO which is capable of controlling an oscillation frequency by means of voltage is used as a local oscillating source of a receiving system or an intermediate frequency signal source of a transmitting system. The VCO is not used as a single unit but is used by being incorporated as a part of a phase-locked loop (PLL). As for the VCO which is used as the intermediate frequency signal source of the transmitting system, its oscillation frequency is modulated by a modulating signal. Phase-shift keying (FSK) is one desirable system of modulation. In a communication apparatus which combines transmitting and receiving functions, one VCO is used jointly for the transmitting system and the receiving system.

FIG. 4 is a block diagram illustrating a schematic configuration of a frequency conversion portion of a communication apparatus of this type. In this drawing, 1T denotes a transmitting mixer (frequency mixing circuit), and 1R denotes a receiving mixer.

First input signals of these mixers 1T and 1R are both supplied from a VCO 2. A second input signal of the transmitting mixer 1T is an internal local oscillation signal of a fixed frequency. A second input signal of the receiving mixer 1R is a high frequency.

Each of the mixers 1T and 1R outputs a beat signal having a frequency corresponding to the difference or sum of two input signals. An output of the transmitting mixer 1T becomes a transmitting RF signal, while an output of the receiving mixer 1R becomes an intermediate frequency (IF) signal. In a case where the frequency of a received RF signal is high, the output of the receiving mixer 1R becomes a first IF signal.

The VCO 2 is built in a closed loop including a PLL circuit 3 and a loop filter circuit 4, and the oscillation frequency is stabilized. In general, a circuit block including the VCO 2, the PLL circuit 3, and the loop filter 4 is contained in a signal generator called a PLL module 5 in one chip. In the example of FIG. 4, a crystal oscillator which is externally connected to the PLL circuit 3 and an external circuit for inputting a modulating signal for transmission to the VCO 2 are omitted in the drawing.

As shown in FIG. 4, in the configuration of the apparatus in which an output terminal of the conventional PLL module 5 in which the VCO 2 is disposed in an output stage is directly coupled to the input sides of the mixers 1T and 1R, the impedance in a stage following the mixers 1T and 1R is liable to be affected by the output impedance of the VCO 2 and a change in the oscillation frequency.

SUMMARY OF THE INVENTION

An object of the present invention is to provide a signal generator which overcomes the above-described problem, and in which the impedance subsequent to mixers need not be changed even if an output terminal of the signal generator is directly coupled to the mixers for which an output of a VCO is set as one input signal.

The above object of the present invention can be attained by a signal generator which imparts one of two input signals to a frequency mixing circuit which mixes two input signals and outputs a signal having a frequency which is a difference between frequencies of the two signals or a sum thereof, comprising: a voltage-controlled oscillator for generating one of the input signals; an attenuating circuit for attenuating an output signal of the voltage-controlled oscillator; and a filter circuit for limiting a frequency band of an output signal from the attenuating circuit.

In accordance with an embodiment of the present invention, the voltage-controlled oscillator is used jointly for a frequency mixing circuit for transmission and a frequency mixing circuit for reception of an FSK transmitting/receiving apparatus, for example. As a more specific configuration, the voltage-controlled oscillator is incorporated as a part of a phase-locked loop, and the attenuating circuit and the filter circuit are built in a PLL module in which the phase-locked loop including the voltage-controlled oscillator is formed as one chip.

DETAILED DESCRIPTION OF PREFERRED EMBODIMENTS

Figure 1:
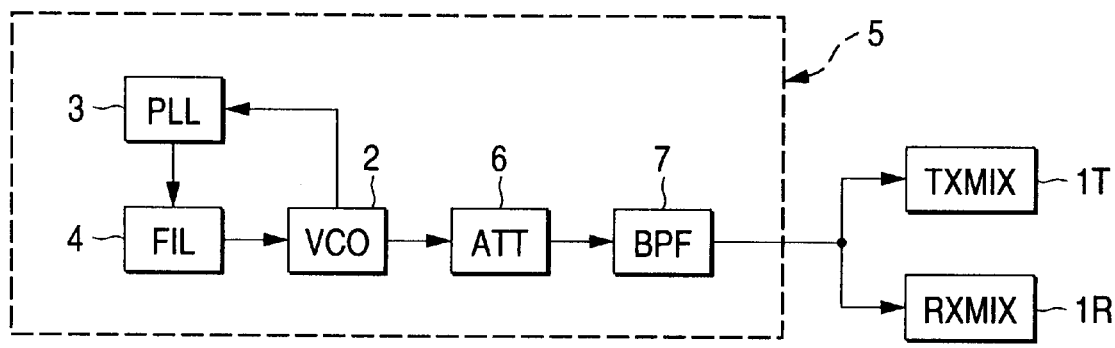
FIG. 1 is a block diagram illustrating an embodiment of a signal generator in accordance with the present invention.
Figure 4:
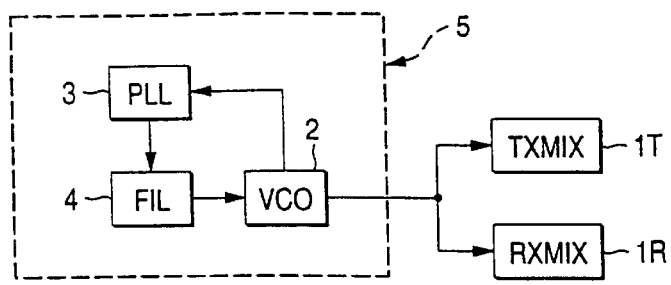
FIG. 4 is a block diagram illustrating one example of a conventional frequency converter.

Referring to an embodiment shown in the drawings, a detailed description will be given hereafter of the present invention. FIG. 1 is a block diagram illustrating an embodiment of the present invention. A signal generator in accordance with the present invention in this drawing is realized as a PLL module 5 in one chip. Included in this PLL module 5 is a VCO 2, a PLL circuit 3, and a loop filter circuit 4 which constitute a PLL loop similar to that shown in FIG. 4. In addition, in the present invention, the configuration provided is such that an output signal from the VCO 2 is supplied to the outside, e.g., transmitting and receiving mixers 1T and 1R, through an attenuating circuit (ATT) 6 and a low-pass filter (LPF) 7.

Figure 2:
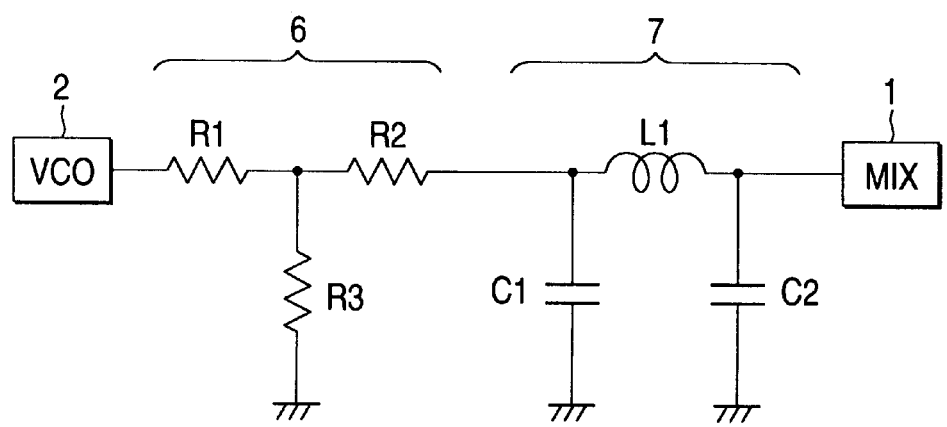
FIG. 2 is a circuit diagram illustrating the details of essential portions of FIG. 1.

FIG. 2 is a diagram illustrating an example of the circuitry of the ATT 6 and the LPF 7. The ATT 6 shown in this example is a signal attenuating circuit (attenuator) which is configured in a T-type by using two resistors R1 and R2 connected in series to an output signal line of the VCO 2, as well as a resistor R3 connected between a point of mutual connection between these resistors R1 and R2 and the grounding. The amount of attenuation imparted to the output signal from the VCO 2 by this ATT 6 is set by the respective values of the resistors R1 to R3. The LPF 7 is a circuit having a low pass characteristic and configured in a pi-type by using a coil L1 connected in series between an output terminal of the ATT 6 and an input terminal of the mixer 1, i.e., an output terminal of the PLL module 5, as well as capacitors C1 and C2 which are respectively connected between each end of the coil L1 and the grounding.

As is apparent from the configuration shown in FIGS. 1 and 2, in accordance with the present invention, since the ATT 6 and the LPF 7 are interposed between the VCO 2 and the mixer 1, the output impedance of the VCO 2 and the input impedance of the mixer 1 do not affect each other (impedance matching can be established). For this reason, the effect of change in the impedance is not imparted to the circuitry subsequent to the mixer 1. In the illustrated example, the ATT 6 and the LPF 7 are illustrated as external circuits of the VCO 2, a configuration is conceivable in which the ATT 6 and the LPF 7 are included in the VCO 2.

Figure 3:
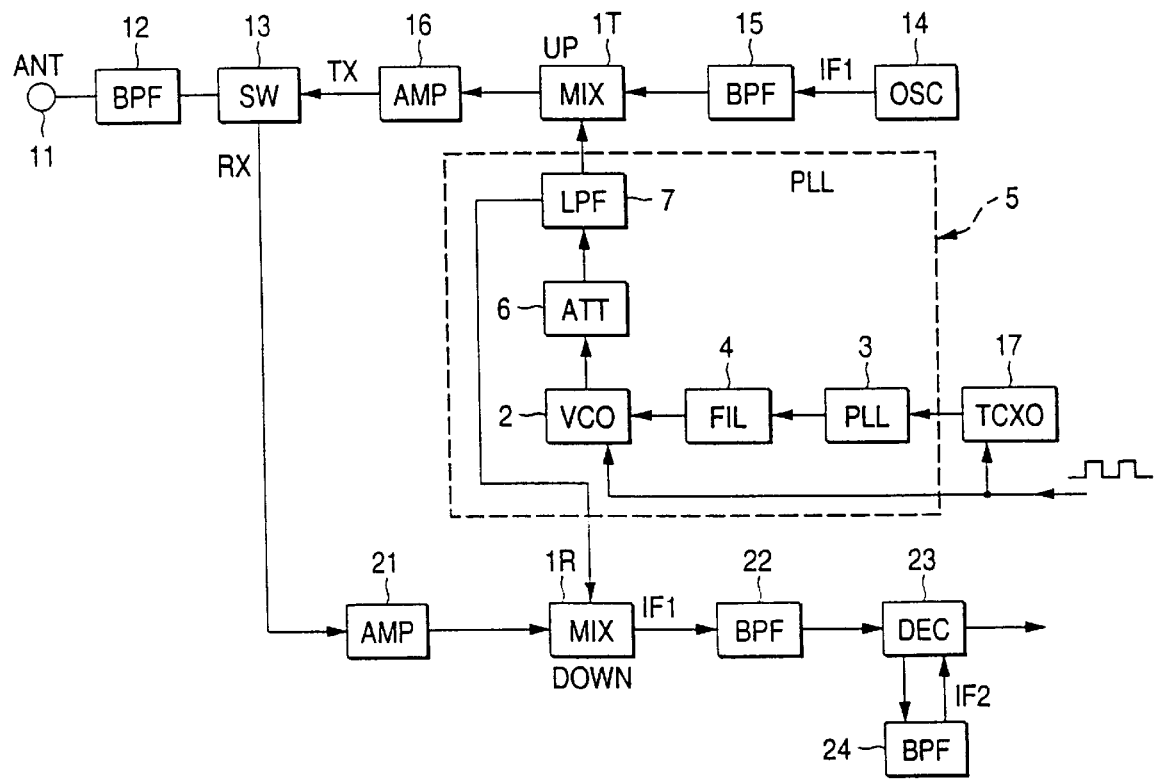
FIG. 3 is a block diagram illustrating a specific example in which the present invention is applied to an FSK transmitting/receiving apparatus.

FIG. 3 is a block diagram illustrating a specific example in which the signal generator in accordance with the present invention is applied to an FSK transmitting/receiving apparatus. In the drawing, reference numeral 11 denotes an antenna (ANT) connecting terminal; 12, an RF-band BPF used jointly for transmission and reception; and 13, a switch (SW) for changing over the transmission and reception. A transmission system is comprised of a local oscillator (OSC) 14 of a fixed frequency, a BPF 15, the mixer 1T, and an RF-band amplifier (AMP) 16. The oscillation frequency of the OSC 14 is a frequency (e.g., 21.05 MHz) of a first intermediate signal IF1. Accordingly, the BPF 15 is for the IF band. The transmitting mixer 1T mixes the output of the BPF 15 and the output of the PLL module 5 of the present invention (effects up-conversion), and outputs a transmission RF signal TX of a frequency (e.g., 429 MHz) which is the sum of the two outputs. The output of the PLL module 5 during transmission is subjected to FSK modulation by the modulating input signal. An element 17 connected to the PLL circuit 3 from outside the PLL module 5 is a crystal oscillator. The modulating signal is supplied to the crystal oscillator 17 and the VCO 2.

A reception system is comprised of an RF amplifier 21, the receiving mixer 1R, a first IF-band BPF 22, a demodulation circuit 23, and a second IF-band BPF 24. The RF amplifier 21 amplifies a received RF signal. The receiving mixer 1R mixes the received RF signal and the output of the PLL module 5 (effects down-conversion), and outputs the first intermediate signal IF1 of a frequency which is the difference between the two signals. The BPF 22 eliminates a noise component in the first intermediate signal IF1. The demodulation circuit 23 converts the first intermediate signal IF1 into a a second intermediate signal IF2 of an even lower frequency (e.g., 450 KHz) by using the BPF 24, and effects FSK demodulation, thereby outputting a demodulated signal in the baseband.

As described above, in accordance with the present invention, it is possible to provide a signal generator in which the impedance subsequent to mixers need not be changed even if an output terminal of the signal generator is directly coupled to the mixers for which an output of a VCO is set as one input signal.

What is claimed is:

1. A signal generator which imparts one of two input signals to a frequency mixing circuit which mixes two input signals and outputs a signal having a frequency which is a difference between frequencies of the two signals or a sum thereof, comprising:

a voltage-controlled oscillator which generates one of the input signals; and means for isolating said voltage-controlled oscillator from said frequency mixing circuit to improve impedance matching between said signal generator and said frequency mixing circuit said isolating means including:
(a) an attenuating circuit which attenuates an output signal of said voltage-controlled oscillator, and
(b) a filter circuit which limits a frequency band of an output signal from said attenuating circuit, wherein said voltage-controlled oscillator and said isolating means are incorporated within a single module.

2. The signal generator according to claim 1, wherein said voltage-controlled oscillator is used jointly for a frequency mixing circuit for transmission and a frequency mixing circuit for reception.

3. The signal generator according to claim 1, wherein said voltage-controlled oscillator is incorporated as a part of a phase-locked loop.

4. The signal generator according to claim 1, wherein said attenuating circuit and said filter circuit are built in a PLL module in which said phase-locked loop including said voltage-controlled oscillator is formed on said single module.

5. The signal generator according to claim 2, wherein said attenuating circuit and said filter circuit are built in a PLL module in which said phase-locked loop including said voltage-controlled oscillator is formed on said single module.

6. The signal generator according to claim 3, wherein said attenuating circuit and said filter circuit are built in a PLL module in which said phase-locked loop including said voltage-controlled oscillator is formed on said single chip.

7. The signal generator according to claim 1, wherein said attenuating circuit has a T-type configuration which includes:

a first resistor and a second resistors connected in series to an output signal line of said voltage controlled oscillator; and a third resistor connected between a point of mutual conductance between said first resistor and said second resistor.

8. The signal generator according to claim 7, wherein said first resistor and said third resistor have values which result in said attenuating circuit having a predetermined level of attenuation.

9. The signal generator according to claim 1, wherein said filter circuit has a pi-type configuration which includes:

a coil connected in series between an output terminal of said attenuating circuit and an input terminal of said frequency mixing circuit; and a first capacitor and a second capacitor respectively connected between ends of said coil.

* * * * *